(12) United States Patent
Tsukamoto

(10) Patent No.: US 8,242,580 B2
(45) Date of Patent: Aug. 14, 2012

(54) SEMICONDUCTOR DEVICE

(75) Inventor: Akiko Tsukamoto, Chiba (JP)

(73) Assignee: Seiko Epson Instruments Inc., Chiba (JP)

( * ) Notice: Subject to any disclaimer, the term of this patent is extended or adjusted under 35 U.S.C. 154(b) by 227 days.

(21) Appl. No.: 12/700,124

(22) Filed: Feb. 4, 2010

(65) Prior Publication Data
US 2010/0200952 A1   Aug. 12, 2010

(30) Foreign Application Priority Data

Feb. 6, 2009 (JP) ................... 2009-026503

(51) Int. Cl.
*H01L 29/8605* (2006.01)
(52) U.S. Cl. ................ 257/538; 257/380; 257/528
(58) Field of Classification Search .......... 257/380, 257/363, 538
See application file for complete search history.

(56) References Cited

U.S. PATENT DOCUMENTS

| 2002/0047183 | A1 | 4/2002 | Shiiki et al. |
| 2006/0027894 | A1* | 2/2006 | Harada ................. 257/538 |
| 2006/0238292 | A1* | 10/2006 | Beach et al. ............ 338/309 |
| 2007/0023844 | A1* | 2/2007 | Tsukamoto et al. ....... 257/380 |

FOREIGN PATENT DOCUMENTS

JP   2002-076281 A   3/2002

* cited by examiner

*Primary Examiner* — Mamadou Diallo
(74) *Attorney, Agent, or Firm* — Brinks Hofer Gilson & Lione

(57) ABSTRACT

Provided is a method which is capable of producing polycrystalline silicon resistors with a high ratio accuracy so that a precision resistor circuit may be designed. A semiconductor device has a structure in which an occupation area of a metal portion covering a low concentration impurity region constituting each of the polycrystalline silicon resistors is adjusted so that ratio accuracy may be further corrected after a resistance is corrected.

7 Claims, 4 Drawing Sheets

SEMICONDUCTOR DEVICE

RELATED APPLICATIONS

This application claims priority under 35 U.S.C. §119 to Japanese Patent Application No. 2009-026503 filed on Feb. 6, 2009, the entire content of which is hereby incorporated by reference.

BACKGROUND OF THE INVENTION

1. Technical Field

The present invention relates to a semiconductor device having a bleeder resistor composed of resistors formed by polycrystalline silicon.

2. Description of the Related Art

In a semiconductor integrated circuit, a diffused resistor or a polycrystalline silicon resistor is used. The diffused resistor is made from a single crystalline silicon semiconductor substrate into which impurities of the opposite conductivity-type to that of the semiconductor substrate are implanted. The polycrystalline silicon resistor is formed of polycrystalline silicon into which impurities are implanted. The polycrystalline silicon resistor has, in particular, advantages in small leakage current due to insulating films surrounding the resistor and in a high resistance brought by defects existing at grain boundaries, leading to wide use in semiconductor integrated circuits.

FIGS. 3A and 3B are a schematic plan view and a schematic sectional view of a conventional polycrystalline silicon resistor circuit, respectively. The polycrystalline silicon resistor is produced by implanting p-type or n-type impurities to a polycrystalline silicon thin film deposited on an insulating film by low pressure chemical vapor deposition (LPCVD) or the like, and then processing the resultant into a resistor shape with a photolithography technology. Impurity implantation is performed for determining a resistivity of the polycrystalline silicon resistor. Depending on a desired resistivity, a concentration of the p-type or n-type impurities to be implanted ranges from $1\times10^{17}/cm^3$ to $1\times10^{20}/cm^3$. Further, at each terminal on both sides of the resistor, a contact hole and a metal wiring are formed to obtain the potential thereof. A satisfactory ohmic contact between the polycrystalline silicon and the metal wiring layer at the terminal requires selective implantation of impurities at a high concentration of equal to or more than $1\times10^{20}/cm^3$, by using a patterned photo resist, into a portion of the polycrystalline silicon corresponding to the terminal of the resistor.

The resistor using the polycrystalline silicon is structured, as illustrated in the schematic plan view of FIG. 3A and the schematic sectional view of FIG. 3B, to include a polycrystalline silicon 103 made of a low concentration impurity region 104 and a high concentration impurity region 105, which is formed on an insulating film 102 on a semiconductor substrate 101. A potential is obtained from a metal wiring 107 through a contact hole 106 formed above the high concentration impurity region 105.

Further, as illustrated in FIG. 3B, a metal is placed on the above-mentioned polycrystalline silicon 103 made of the low concentration impurity region 104 and the high concentration impurity region 105 so as to prevent hydrogen, which affects a resistance of the polycrystalline silicon, from diffusing into the polycrystalline silicon in a semiconductor process. The polycrystalline silicon is composed of grains having relatively high crystallinity and a grain boundary between the grains which has low crystallinity, that is, a high level density. The resistance of the polycrystalline silicon resistor is mostly determined by electrons or holes, which serve as carriers, trapped by a large number of levels existing at the grain boundary. However, when hydrogen having a high diffusion coefficient is generated in a semiconductor manufacturing process, the hydrogen easily reaches the polycrystalline silicon to be trapped by the levels, thus varying the resistance. Examples of the hydrogen generating process include a sintering step in a hydrogen atmosphere after metal electrode formation and a forming step of a plasma nitride film using an ammonia gas. Covering the polycrystalline silicon resistor with the metal wiring layer may suppress the variation of the resistance of the polycrystalline silicon due to the hydrogen diffusion.

The method for stabilizing the resistance of the polycrystalline silicon is disclosed in JP 2002-076281 A, for example.

However, the method for stabilizing the resistance of the polycrystalline silicon has the following problem. That is, there is a problem in the semiconductor manufacturing process that the metal on the polycrystalline silicon is susceptible to factors other than hydrogen which affect the polycrystalline silicon, such as heat, stress, and charging due to plasma. Those factors affect the polycrystalline silicon through the metal thereon, resulting in the variation of the resistance.

Further, the resistance may be changed due to a difference between a potential of the metal provided above and a potential of the resistor provided below. This is conceivably because, by using the resistor formed of the polycrystalline silicon into which a large number of impurities are implanted, the above-mentioned potential difference causes the impurity concentration to be changed in the polycrystalline silicon resistor. Therefore, the way of obtaining the potential from the metal portion provided above also affects the variation of the resistance.

In a circuit using a bleeder resistor, for example, a circuit such as a voltage detector or a voltage regulator, an output current/voltage value is determined by a ratio of bleeder resistances. However, when the resistances change even slightly, a resistance ratio accuracy of a resistor group is reduced and hence a desired value for the output current/voltage value may not be obtained. This leads to a lowered yield especially in a case of a product requiring precision.

SUMMARY OF THE INVENTION

The present invention has been made to solve the above-mentioned problems, and an object of the present invention is therefore to provide a method for realizing a polycrystalline silicon resistor having higher ratio accuracy than that may be realized by a conventional method.

In order to solve the above-mentioned problems, the present invention adopts the following means.

First, provided is a semiconductor device including a resistor, which includes: a semiconductor substrate; a first insulating film formed on the semiconductor substrate; a plurality of resistors having the same shape, which are formed on the first insulating film and formed of polycrystalline silicon including a low concentration impurity region and a high concentration impurity region; a second insulating film formed on the plurality of resistors; a contact hole formed through the second insulating film above the high concentration impurity region; a first metal wiring which is connected to the contact hole and connects the plurality of resistors formed of polycrystalline silicon; and a second metal portion disposed on the second insulating film so as to cover the low concentration impurity region in a resistor group including one of a single resistor and at least two resistors connected to one another.

In addition, the semiconductor device has a structure in which some of the resistors form a resistor group and a fuse between the resistors is trimmed to obtain a desired value.

Further, the semiconductor device has a structure in which the second metal portion may be changed in area by trimming.

According to the present invention, by correcting a resistance ratio in the semiconductor device, it is possible to manufacture polycrystalline silicon resistors with a more stable resistance ratio. By employing the resistor circuit of the present invention, it is possible to provide a bleeder resistor with a high ratio accuracy because, depending on the structure of the resistor circuit, trimming is further performed based on a value obtained by the first trimming.

DETAILED DESCRIPTION OF THE PREFERRED EMBODIMENTS

Now, embodiments of the present invention are described with reference to the drawings.

Figure 1A:
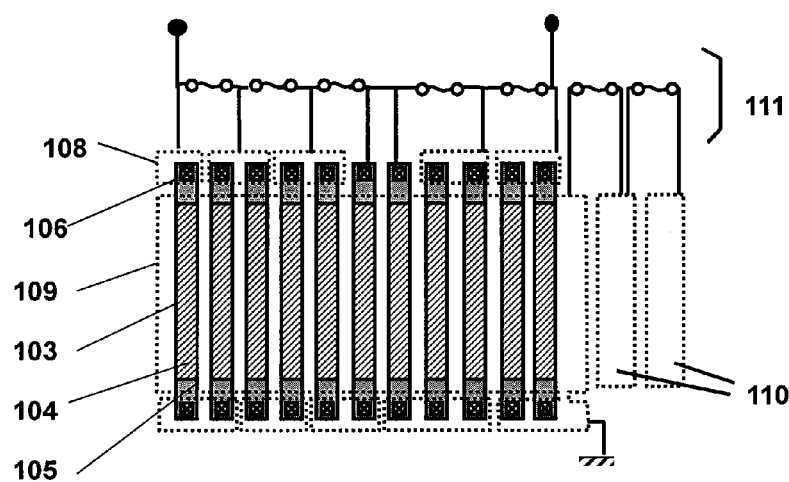
FIG. 1A is a schematic plan view illustrating a semiconductor device according to a first embodiment of the present invention.
Figure 1B:
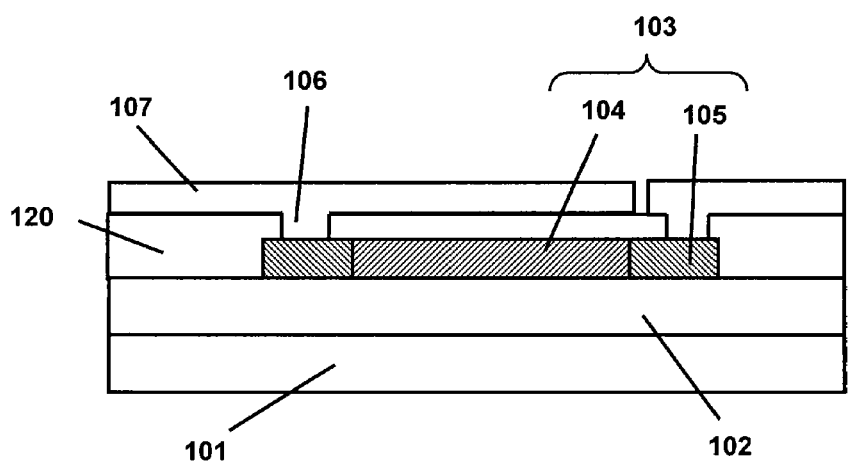
FIG. 1B is a schematic sectional view illustrating the semiconductor device according to the first embodiment of the present invention.

FIGS. 1A and 1B are a schematic plan view and a schematic sectional view of a semiconductor device according to a first embodiment of the present invention, respectively. As in a conventional case, a resistor group is formed of polycrystalline silicon 103 which is formed on a first insulating film 102 on a semiconductor substrate 101 and includes a low concentration impurity region 104 and a high concentration impurity region 105 on both end of the low concentration impurity region 104, and a potential is obtained from a metal wiring 107 including a first metal portion 108 through a contact hole 106 formed through a second insulating film 120 above the high concentration impurity region 105. Further, the polycrystalline silicon 103 is covered by a second metal portion 109. A third metal portion 110 is disposed adjacent to the second metal portion and connected through a fuse for trimming. The second metal portion is structured to be connected to a fuse for trimming, which is formed of polycrystalline silicon, to which polycrystalline silicon resistors and the first metal portion are connected, so that the area of the metal portion having the same potential can be changed by cutting the fuse to separate a part of the third metal portion or all of the third metal portion. The connection is illustrated in FIG. 1A. In this case, the second metal portion 109 covering only one unit resistor is connected to no other portion or to the substrate. The present invention is intended to correct a resistance ratio deviation of a resistor, which is caused by laying out a semiconductor device with a conventional technology, by increasing or decreasing an area of a low concentration impurity region as described below.

As mentioned in the description of the conventional technology, examples of factors which influence a metal during a semiconductor manufacturing process include the following factors.

That is, in the semiconductor manufacturing process, the metal on the polycrystalline silicon is susceptible to factors other than hydrogen which affect the polycrystalline silicon, such as heat, stress, and charging due to plasma. Therefore, those factors affect the polycrystalline silicon through the metal portion thereon, resulting in the variation of the resistance. The factors described above vary depending on an area of an upper portion, that is, the second metal portion. Thus, it is found that the resistance is varied owing to the area of the second metal portion.

Figure 4:
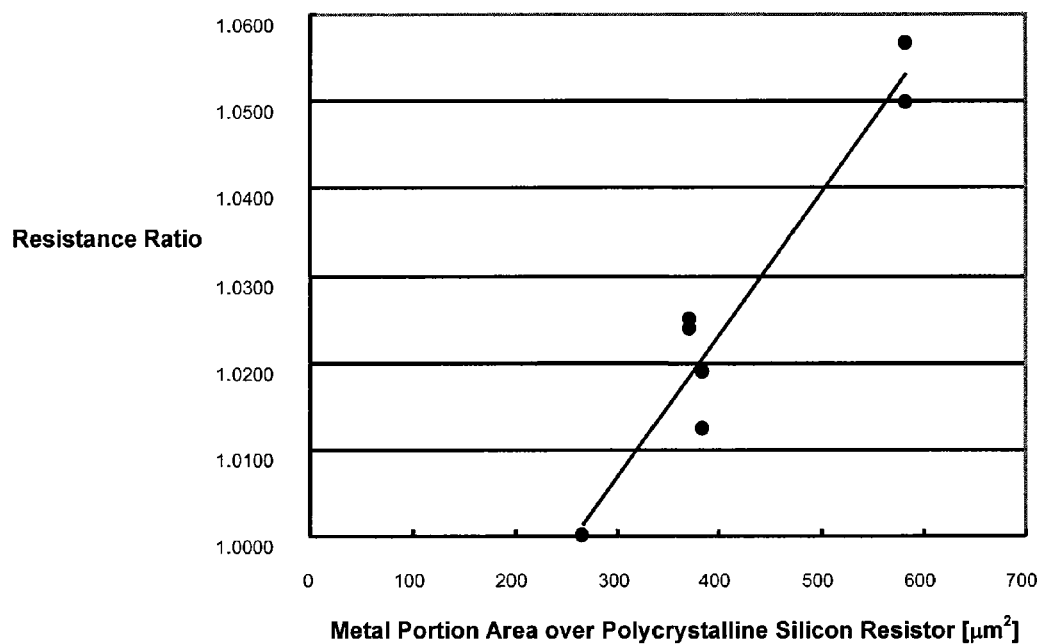
FIG. 4 is a graph illustrating relationship between resistance ratio and surface area of a second metal portion of a resistor.

FIG. 4 is a graph illustrating that, on an assumption that the resistance of the polycrystalline silicon resistor is set to 1, a ratio (resistance ratio) depends on the area of the second metal portion. It is apparent from FIG. 4 that the area of the second metal portion and the resistance of the polycrystalline silicon resistor have a proportional relationship. Accordingly, an increase in the area of the second metal portion may increase the resistance.

The present invention takes advantage of the above-mentioned relationship, and has a feature of correcting the resistance by changing the area of the second metal portion. This is performed after the above-mentioned resistance correction. This is a remedy for a case where the above-mentioned correction does not give a desired resistance and the value deviates from the desired resistance. Therefore, trimming is further performed based on the value obtained by the first trimming to thereby provide a bleeder resistor with high ratio accuracy.

It is understandable from FIG. 4 that when the area of the second metal portion is increased by 50 $\mu m^2$, the resistance ratio is increased by 1%. Based on this fact, a layout is generated taking the increase in area into consideration.

For example, as illustrated in FIG. 1A, a second metal portion is placed above the polycrystalline silicon resistors each including the low concentration impurity region and the high concentration impurity region to entirely cover the resistor group. This layout has an effect of preventing hydrogen from diffusing into the polycrystalline silicon resistors during a heat treatment such as a densifying step in manufacturing an interlayer film formed of borophosphosilicate glass (BPSG) or the like, or metal annealing in manufacturing a metal wiring layer, which is performed after the step of manufacturing the polycrystalline silicon resistors. The second metal portion 109 is connected to a third metal portion 110 for adjusting the area. This connection is through a fuse for trimming 111 formed of polycrystalline silicon. Note that the steps are simpler when the third metal portion 110 is formed of the same material as the second metal portion 109, and is preferably formed of an aluminum alloy, for example.

As illustrated in FIG. 1A, a plurality of the third metal portions 110 are provided, and the third metal portions 110 are connected to each other via a fuse for trimming. By cutting the fuse for trimming 111 connected to the third metal portions 110 as necessary, the metal portions are separated and change the area to thereby obtain the desired resistance ratio. In FIG. 1A, two third metal portions 110 are disposed. However, when an occupation area of a single third metal portion 110 is reduced and the number of the third metal portions 110 is increased, finer adjustment may be performed.

Figure 2:
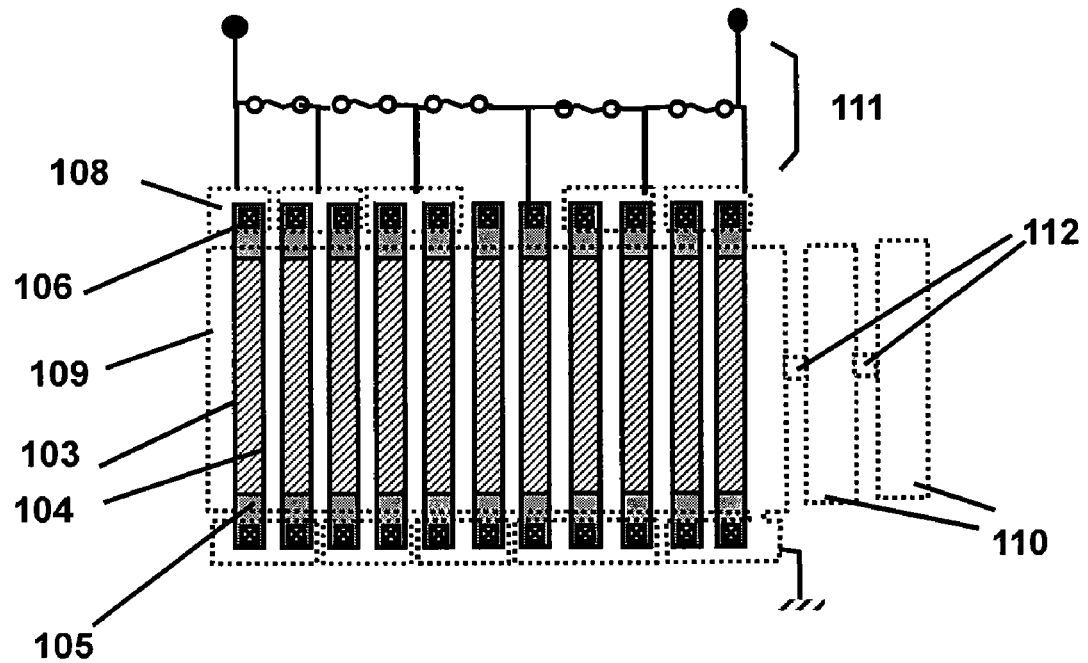
FIG. 2 is a schematic plan view of a semiconductor device according to a second embodiment of the present invention.
Figure 3A:
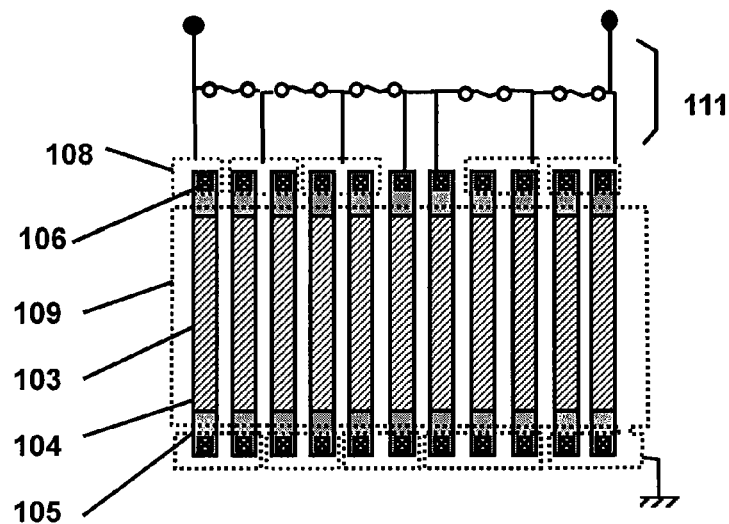
FIG. 3A is a schematic plan view of a conventional polycrystalline silicon resistor circuit.
Figure 3B:
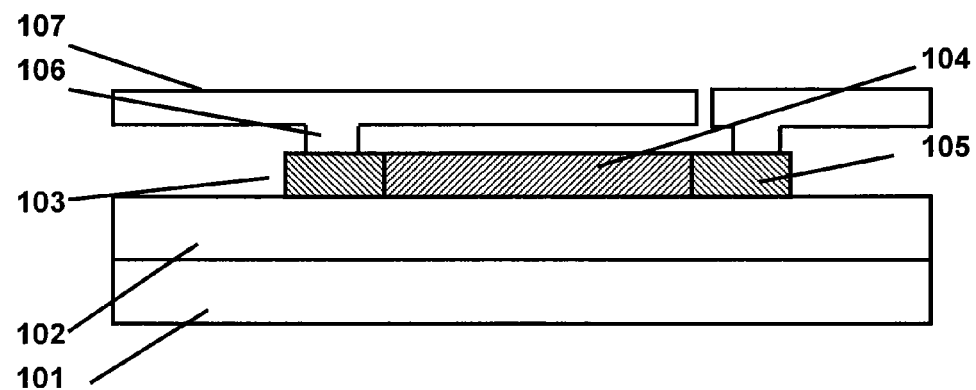
FIG. 3B is a schematic sectional view of the conventional polycrystalline silicon resistor circuit.

FIG. 2 illustrates a schematic plan view illustrating a semiconductor device according to a second embodiment of the present invention. FIG. 2 is different from FIG. 1A in the way of connecting the third metal portions. Specifically, as opposed to the fuse used in the first embodiment, the third metal portions 110 are connected to the second metal portion 109 and to each other via a metal portion connecting portion 112 formed of the same material as the third metal portion in the second embodiment. By cutting the metal portion connecting portion 112 by laser or the like as necessary, the metal portion may be changed in area to thereby obtain the desired resistance ratio.

As described above, the resistance ratio may be adjusted by connecting the second metal portion to the third metal portion so that the area may be varied.

What is claimed is:

1. A semiconductor device, comprising:
    a semiconductor substrate;
    a first insulating film on the semiconductor substrate;
    a plurality of resistors having a same shape, which are disposed on the first insulating film and comprising polycrystalline silicon each having a low concentration impurity region and a high concentration impurity region abutting end portions of the low concentration impurity region;
    a second insulating film overlying the plurality of resistors;
    a contact hole extending through the second insulating film and exposing a portion of the high concentration impurity region;
    a first metal portion comprising a metal wiring layer traversing the contact hole and connecting the plurality of resistors;
    a second metal portion disposed on the second insulating film so as to cover the low concentration impurity region of a resistor group including one of a single resistor and more than two resistors connected to one another selected from the plurality of resistors; and
    a third metal portion provided adjacent to the second metal portion and coupled to the second metal portion by a severable connection, such that the effective area of the second metal portion includes the third metal portion, wherein the third metal portion is subject to electrical separation from the second metal portion upon breaking the severable connection.

2. A semiconductor device according to claim 1, wherein the severable connection between the second metal portion and the third metal portion comprises a fuse.

3. A semiconductor device according to claim 1, wherein the severable connection between the second metal portion and the third metal portion comprises a metal connecting portion configured to be cut by laser.

4. A semiconductor device according to claim 1, wherein the area of the second metal portion can be decreased by laser trimming.

5. A semiconductor device according to claim 1, wherein the second metal portion is disposed so as to entirely cover the resistor group.

6. A semiconductor device according to claim 1, wherein the second metal portion and the third metal portion comprises portions of the metal wiring layer.

7. A semiconductor device according to claim 1, wherein a resistance ratio of the semiconductor device changes in direct proportion to the effective area of the second metal portion.

* * * * *